United States Patent
Drimer et al.

(10) Patent No.: US 6,179,609 B1
(45) Date of Patent: Jan. 30, 2001

(54) COMPACT EXTERNAL TORCH ASSEMBLY FOR SEMICONDUCTOR PROCESSING

(75) Inventors: Gideon Drimer, Jerusalem; Leo Mendelovici, Mevaseret Zion; Nachum Borivker, Jerusalem, all of (IL)

(73) Assignee: Persys Technology Ltd., Jerusalem (IL)

( * ) Notice: Under 35 U.S.C. 154(b), the term of this patent shall be extended for 0 days.

(21) Appl. No.: 09/346,685

(22) Filed: Jul. 2, 1999

(30) Foreign Application Priority Data

Aug. 5, 1998 (IL) .......................................... 125669
Aug. 5, 1998 (IL) .......................................... 125670

(51) Int. Cl.[7] ............................. F23D 11/44; F23L 15/00
(52) U.S. Cl. ...................... 431/11; 431/208; 431/160; 431/259; 431/181; 431/12; 431/347; 60/39.828
(58) Field of Search ............................... 431/11, 12, 159, 431/160, 326, 328, 181, 350, 353, 208, 240, 158, 347, 258, 259; 60/39.821, 39.828; 123/145 A; 239/132

(56) References Cited

U.S. PATENT DOCUMENTS 3,964,943 * 6/1976 Anderson ................................. 156/6
4,342,551 * 8/1982 Browning .............................. 431/158
4,825,658 * 5/1989 Beebe ................................. 60/39.828
4,916,904 * 4/1990 Ramsaier et al. ..................... 431/158
5,149,261 * 9/1992 Suwa et al. .......................... 431/353
5,257,926   11/1993 Drimer et al. ....................... 431/158
5,314,008 * 5/1994 Garcia-Mallol ...................... 431/160

FOREIGN PATENT DOCUMENTS

2501894A1 * 7/1975 (DE) .

* cited by examiner

Primary Examiner—Ira S. Lazarus
Assistant Examiner—Josiah C. Cocks
(74) Attorney, Agent, or Firm—Nixon & Vanderhye P.C.

(57) ABSTRACT

A compact torch for use in semiconductor processing which may be used both to produce steam and to perform wet or dry dichlorethylene (DCE) oxidation at varying concentrations with no reconfiguration of the torch, providing full temperature of control of the oxidation product gases, with redundancy to provide automatic backup of heating and ignition elements, and with non-mechanical flow control of the oxidation product gases.

31 Claims, 8 Drawing Sheets

FIG. 10B

COMPACT EXTERNAL TORCH ASSEMBLY FOR SEMICONDUCTOR PROCESSING

FIELD OF THE INVENTION

The present invention relates generally to torches for use in semiconductor processing.

BACKGROUND OF THE INVENTION

A number of the processes in semiconductor production require introduction of particular chemical substances in an ultrapure state into the process chamber or furnace. For example, wet processes require steam and dry processes require hydrogen chloride (HCl). Both of these are typically produced by oxidation in a torch chamber which feeds the oxidation products into the processing chamber. Known torches are Pyrogenic External Torches (PET) which typically include an external ignition element, a quartz hydrogen/oxygen injector, a quartz torch chamber, a safety shield, and an electronic controller for safety interlocks and operation communications with a main computer controller. Heated streams of hydrogen and oxygen are injected via a nozzle into the torch chamber, in which they ignite, thereby producing steam. These torches may also be configured for HCl production, but they then require additional heaters to maintain HCl oxidation. Existing torches in both cases tend to produce more heat than is needed by the semiconductor processing and are subject to expensive downtime when changing the input gases or in cases of heater failure. A further disadvantage is that flow control of the oxidation products is achieved by mechanical valves, which may introduce contaminants into the gas flow being controlled, especially in the case of hot and/or chemically reactive flows as in semiconductor production.

An indication of the state of the art is the torch assembly disclosed in U.S. Pat. No. 5,257,926 issued to the same assignee as the present application, the contents of which are incorporated herein by reference.

SUMMARY OF THE INVENTION

The present invention seeks to provide a compact torch for use in semiconductor processing which may be used to produce both steam and wet or dry Hydrogen Chloride at varying concentrations with no reconfiguration of the torch, providing full temperature of control of the oxidation product gases, with redundancy to provide automatic backup of heating and ignition elements, and with non-mechanical flow control of the oxidation product gases.

There is thus provided, in accordance with a preferred embodiment of the present invention, for use with a reactor chamber for semiconductor processing, a torch assembly for both combustion and flameless oxidation processes including:

a quartz chamber for sustaining therein combustion and flameless oxidation processes with a longitudinal axis and an open end to allow exit of gaseous oxidation products;

a gas injection subassembly mounted either integrally or removably with sealing apparatus at the other end of the quartz chamber with nozzles and supply conduits for first and second gases;

a starter unit which includes a radiant energy emitter and at least one radiant energy absorber to provide at least one hot spot to initiate oxidation of the gases in a preselected zone of the quartz chamber;

at least one heater mounted within the chamber and generally parallel to the chamber axis for heating the gases to a temperature sufficient to sustain oxidation thereof in the preselected zone of the chamber;

a cooling arrangement in heat exchange association with a wall portion of the chamber; and a controller associated with the torch assembly for controlling operation thereof.

Additionally in accordance with a preferred embodiment of the present invention, the chamber wall portion is a double wall portion with inner and outer leaves defining an interspace and the cooling arrangement includes apparatus for directing a flowable cooling medium via the interspace to be in heat exchange contact with the inner leaf of the wall portion of the chamber, the interspace further having ridges for defining a generally helical flow path for the flowable cooling medium.

Further in accordance with a preferred embodiment of the present invention, the radiant energy emitter includes at least one lamp, which may be a quartz-halogen lamp with a tungsten filament, and the at least one radiant energy absorber includes at least one blackbody member, which may be made of silicon carbide which may be quartz-encapsulated and evacuated, positioned at a predetermined distance from the lamp.

Still further in accordance with a preferred embodiment of the present invention, the at least one heater is at least two heaters each of which is operable alone to heat the gases to a temperature sufficient to sustain oxidation thereof in the preselected zone of the chamber, and wherein the controller is operative, in the case of a failure of at least one of the heaters, to cause a non-failing heater to operate alone so as to heat the gases to a temperature sufficient to sustain oxidation thereof in the preselected zone of the chamber.

Additionally in accordance with a preferred embodiment of the present invention, the gas injection nozzles provide streams of the gases with at least minimum predetermined exit velocities and at predetermined angles each in the range of 5°–90° with respect to the chamber axis, thereby to mix the gases and produce a mixed stream generally parallel to the chamber axis. The nozzles each further have one or more orifices which may be of different diameters; and the supply conduits selectably supply the respective gases to their respective orifices so that the gas outflows will have the minimum predetermined exit velocities. The gas injection subassembly may further have a single emitting surface with all the orifices thereon, wherein the gas streams are emitted at predetermined angles each in the range of 5°–90° with respect to the emitting surface, or two emitting surfaces, one for each gas and its respective orifices, wherein the gas streams are generally perpendicular to the respective emitting surfaces. The gas conduits further include branching and mixing conduits to supply mixtures at preselected concentrations of the gases, where the first gas may be oxygen or a mixture at a preselected concentration of oxygen and dichlorethylene (DCE) vapor suspended at predetermined concentrations in nitrogen and the second gas is hydrogen, which is supplied when steam production is required. The torch assembly may also include a flame detector and a number of temperature sensors associated with the controller.

In accordance with an additional preferred embodiment of the present invention, the torch assembly further includes a flow divertor situated between the open end of the quartz chamber and a reactor chamber for semiconductor production for controlling the flow of the gaseous oxidation products. The flow divertor has:

a primary conduit for conducting gaseous oxidation products from the quartz chamber to the reaction chamber, which may include an auxiliary input conduit for adding preselected auxiliary chemical substances to the gaseous oxidation products flowing in the primary conduit;

a secondary conduit intersecting with and communicating with the primary conduit via an outlet formed in a side wall thereof at a location upstream of the reactor chamber; and apparatus for selectably applying a pressure drop across the primary conduit and the secondary conduit, employing a flow of a carrier fluid or gas, which may be controlled by valves, to produce a Venturi effect in the secondary conduit, thereby causing the gaseous oxidation products in the primary conduit to flow into the secondary conduit, thus to prevent the gaseous oxidation products from reaching the reactor chamber.

BRIEF DESCRIPTION OF THE DRAWINGS

The present invention will be more fully understood and appreciated from the following detailed description, taken in conjunction with the drawings, in which.

DETAILED DESCRIPTION OF THE INVENTION

Figure 1A:
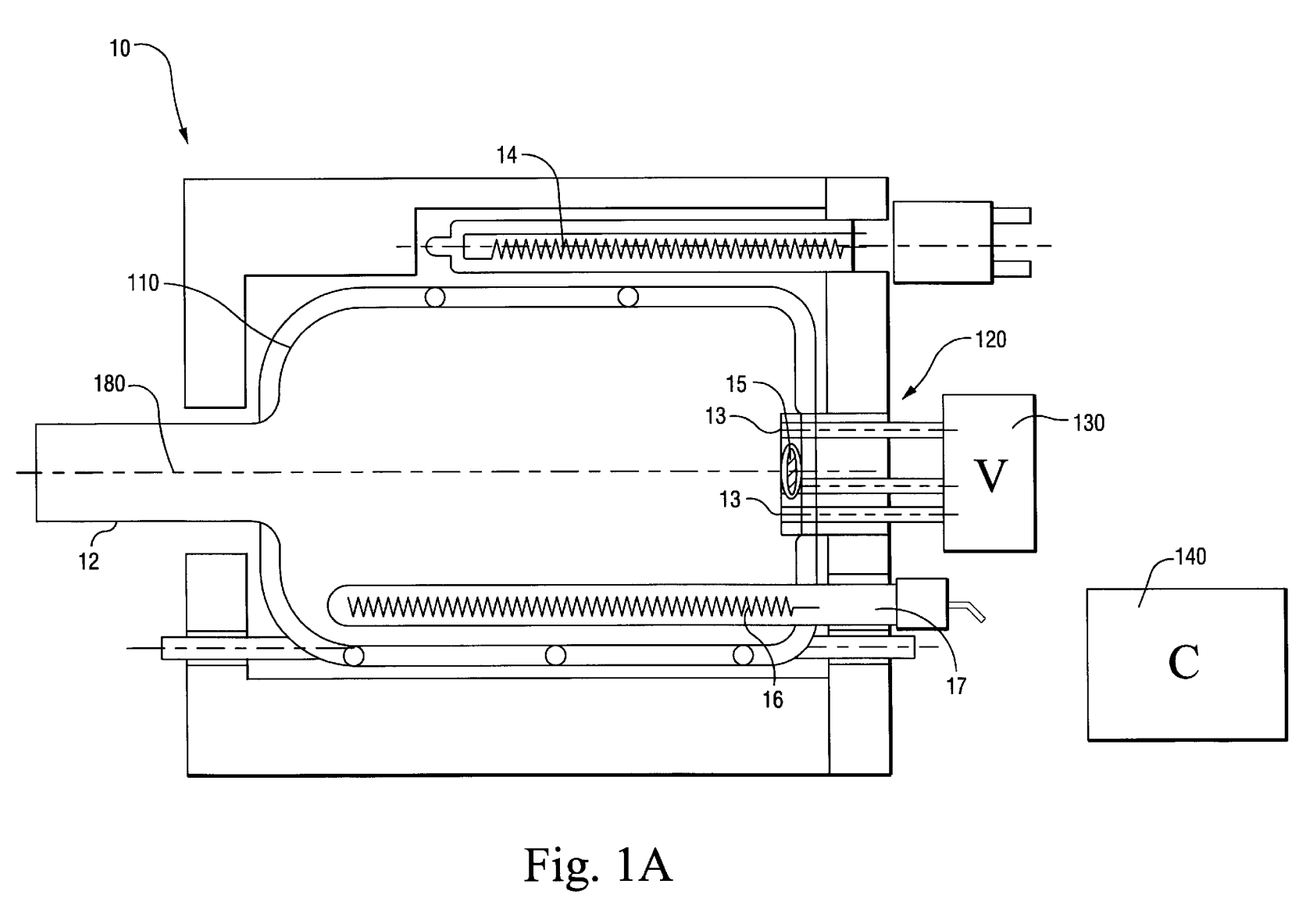
FIG. 1A is a schematic representation of a torch assembly, constructed and operative in accordance with an embodiment of the present invention.

Referring now to FIG. 1A, there is shown a schematic representation of a torch assembly, referred to generally as 10, constructed and operative in accordance with an embodiment of the present invention. Torch assembly 10 includes a quartz chamber 110, wherein oxidation of gases takes place, that defines a longitudinal axis 180 for torch assembly 10. As shown in the drawing, left end 12 of quartz chamber 110 is open and is typically configured for connection with a semiconductor processing furnace (not shown) so that gaseous products of oxidation, for example, ultrapure steam or hydrogen chloride gas, within torch assembly 10 can exit therefrom and be received as input gases by the semiconductor processing furnace. Quartz chamber 110 typically has in association therewith a cooling arrangement (not shown) to prevent excess heating which may result when there is combustion taking place therein.

Opposite open end 12 of quartz chamber 110 is gas injection subassembly, referred to generally as 120, which provides the gases for oxidation to torch assembly 10 which may be mounted either integrally or removably on quartz chamber 110, provided that it be sealed thereon. Gas injection subassembly 120 includes nozzles 13 for oxidation gases configured to produce a mixed flow thereof generally along axis 180. Gas injection subassembly 120 further includes a system of conduits and valves 130, schematically indicated by box V, to supply preselected oxidation gases to nozzles 13.

Combustion of the mixed flow of gases in torch assembly 10 is initiated by an ignition unit including radiant energy source 14 and blackbody radiant energy absorbing member 15. In accordance with a preferred embodiment of the present invention, radiant energy source 14 is one or more quartz-halogen lamps with tungsten filaments and blackbody radiant energy absorbing member 15 is one or more evacuated, quartz-encapsulated, granular silicon-carbide capsules. As described in U.S. Pat. No. 5,257,926, included herein by reference, when lamp 14 is activated, its radiant energy is rapidly absorbed by blackbody member 15, in times typically less than one minute, raising the temperature of blackbody member 15 to the required ignition temperature of the gases in chamber 110. Blackbody member 15 is located close enough to the mixed flow of oxidation gases to provide a hot spot for ignition thereof. For example, when torch assembly 10 is to be used to produce ultrapure steam, hydrogen and oxygen gases are the oxidation gases and blackbody member 15 rises to 760° C., which, according to the safety standards of the semiconductor industry, is a safe ignition temperature therefor.

While combustion in torch assembly 10 could be maintained by the lamp 14 and backbody 15 arrangement described above, as will be understood by persons skilled in the art, tungsten-halogen lamps will have a relatively short lifetime if they are continuously used in such an application. Therefore, in accordance with a preferred embodiment of the present invention, torch assembly 10 includes two or more electric heaters 16 in wells 17 extending into quartz chamber 110 to heat the gases to sustain combustion. As will be described in conjunction with FIGS. 2A and 2B hereinbelow, two or more heaters 16 are employed to provide redundancy and backup capability so that torch operation, and hence, semiconductor processing, can be maintained without interruption even in a case of heater failure. Heaters 16 could also be employed as an ignition device for the combustion gases, but they reach the required temperature somewhat more slowly than the lamp-blackbody arrangement described above.

Torch assembly 10 further includes a flame detector and a number of temperature sensors, typically thermocouples, not shown, positioned at a number of predetermined locations in the assembly. These sensor devices are connected with controller 140, which allow it to monitor the assembly for desired operation. Controller 140 is also connected to electrical devices such as lamp 14 and heater 16 and the valves in V 130 allowing it to control all aspects of torch operation, typically in connection with the controller of the semiconductor processing system to which torch assembly 10 is connected.

Figure 1B:
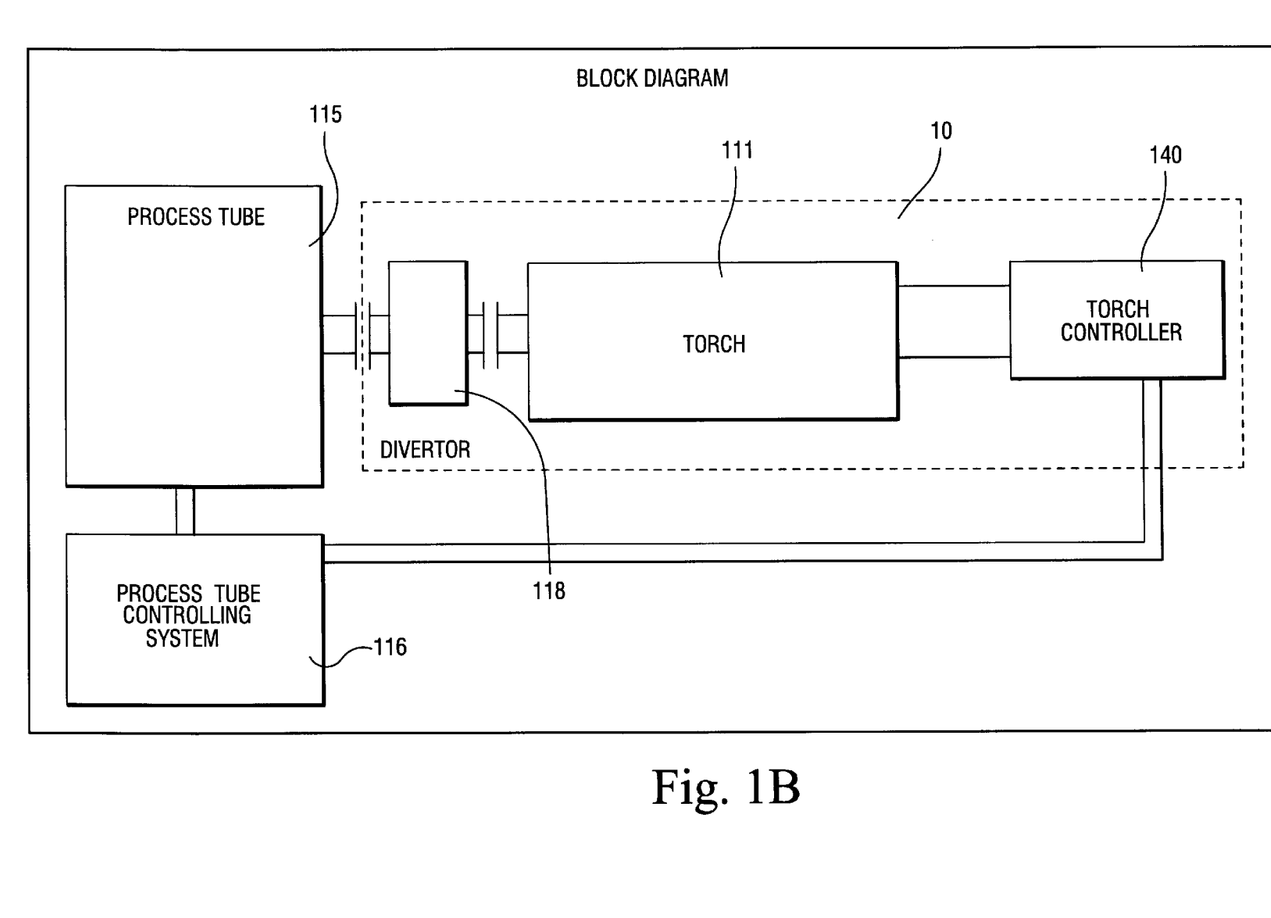
FIG. 1B is a block diagram of a semiconductor processing system employing the torch assembly of the present invention.

Referring briefly to FIG. 1B, there is shown a block diagram of a semiconductor processing system employing a torch assembly 10 constructed and operative in accordance with an alternative embodiment of the present invention. Processing furnace or tube 115 receives as input gases, for example, ultrapure steam or hydrogen chloride gas, which are oxidation products of torch 111, which is controlled by controller 140, which interfaces directly with the control system 116 of process furnace 115. Gas flow from torch 111 to process furnace 115 is controlled by flow divertor 118.

Figure 2A:
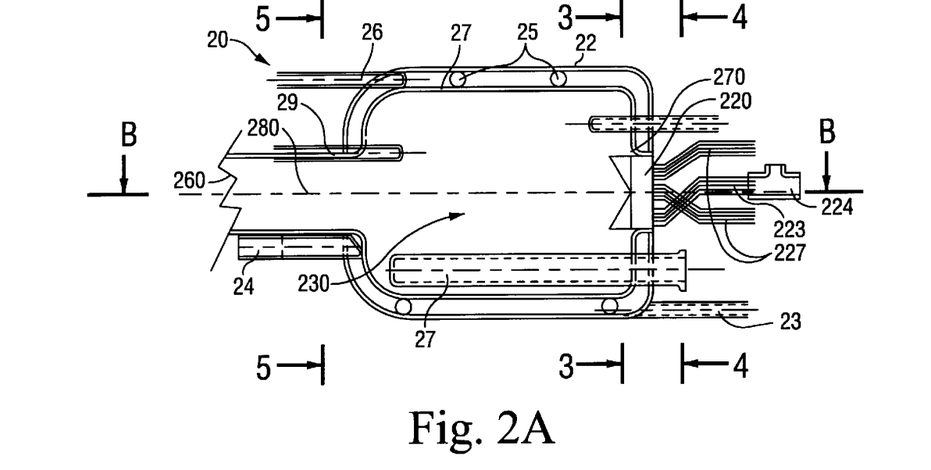
FIGS. 2A and 2B are two side-sectional views, taken perpendicular to one another, of the quartz chamber of a preferred embodiment of the present invention.
Figure 2B:
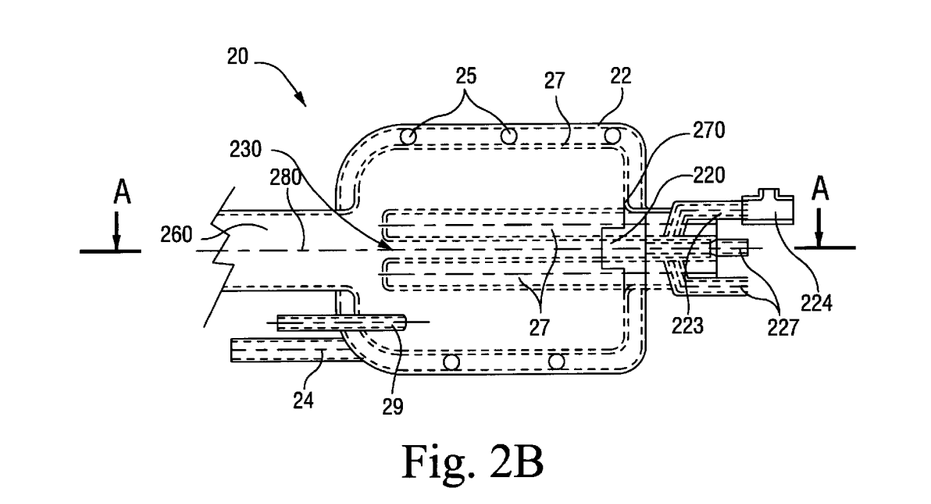

Referring now to FIGS. 2A and 2B, there are shown two side-sectional views, taken perpendicular to one another, along the longitudinal axis 280 of a quartz chamber, referred to generally by reference number 20, of a torch assembly constructed in accordance with a preferred embodiment of the present invention, wherein FIG. 2B is along line B—B in FIG. 2A and FIG. 2A is along line A—A in FIG. 2B.

In accordance with a preferred embodiment of the present invention, quartz chamber 20 is a double-walled enclosure with inner and outer walls, 21 and 22 respectively, enclosing the zone 230 wherein torch oxidation occurs. The space between inner and outer walls 21 and 22 has an inlet tube 23 and an outlet tube 24 to direct a flow of a cooling fluid therethrough to cool, by heat exchange, primarily inner wall 21 to a temperature within a desired temperature range while the torch is operating and hence, producing excess heat. The cooling fluid may be gaseous, such as compressed air, or liquid, such as water. In a preferred embodiment of the present invention, there are formed, on one or both of the mutually facing surfaces of inner and outer walls 21 and 22 helical ridges 25 which direct the flow of the cooling medium in a helical fashion, to provide for more efficient heat exchange between the fluid and the chamber walls. There is also a thin, tubular enclosure 26 extending into the space between inner and outer walls 21 and 22 to house a temperature sensor, such as a thermocouple, to allow monitoring of the temperature by the torch controller 140 (FIG. 1A).

Referring now to FIG. 2B, there are shown two large cylindrical wells 27 preferably parallel to axis 280 of chamber 20. As shown in FIG. 2A, wells 27 extend longitudinally along the length of and below oxidation zone 230 but still within chamber 20. Wells 27 accommodate a pair of heaters (not shown) which heat the oxidation gases to a temperature sufficient to sustain oxidation thereof, once oxidation has started. In accordance with a preferred embodiment of the present invention, the heaters are high-output electrical resistance coil heaters.

Under normal functioning of the torch, the heaters operate together, each at an intermediate power level, to heat the oxidation gases to the required temperature. In accordance with a preferred embodiment of the present invention, each heater is operable alone to produce enough heat to sustain oxidation in the torch. In case of failure or significant power output reduction of one of the heaters, the controller 140 (FIG. 1A) will immediately raise the power in the functioning heater to continue the current semiconductor processing step or sequence of steps through completion without a need to replace the defective heater. It will be appreciated by persons skilled in the art that this capability to maintain uninterrupted operation provided by the redundancy and backup arrangement of the heaters in the present invention is very useful in semiconductor production and a significant improvement over prior art. Further, it should be noted that similar redundancy and backup arrangements employing more than two heaters is also included within the scope of the present invention.

Figure 3:
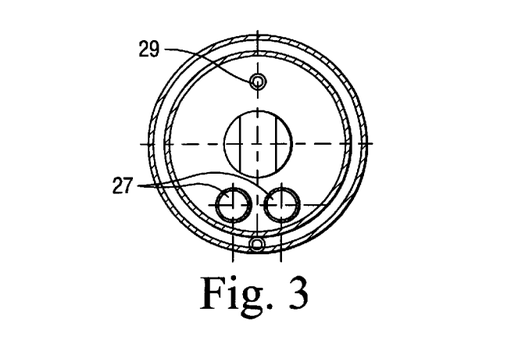
FIG. 3 is a cross-sectional view of the quartz chamber of FIG. 2A, taken along line 3—3 therein.

As is known by persons skilled in the art, existing torches in semiconductor production heat the oxidation zone by means of heating elements externally placed on the chamber walls which inevitably heat the entire chamber. They take longer than the present invention to reach the desired temperature and run the risk of devitrification as a result of excess heating of the chamber walls. The present invention is operable in a desired temperature range which is hot enough to preclude condensation of the steam produced therein, but cool enough to protect against damage to the torch and devitrification thereof and of quartz chamber 20. This is due both to the compact size of the torch of the present invention, and to the internal location of the heaters in heater wells 27 within chamber 20; both factors allow a lower power requirement to heat the entire oxidation zone 230. Referring briefly to FIG. 3, there is shown a cross-sectional view of quartz chamber 20 of FIG. 2A, taken along line 3—3 therein, which shows the positions of heater wells 32 within the chamber. Also shown in the drawing is a thin well 29 (also in FIG. 2A) for housing a temperature sensor, such as a thermocouple, to allow monitoring of the temperature near the oxidation zone 230 by the torch controller 140 (FIG. 1A).

As shown in FIGS. 2A and 2B, left end 260 of chamber 20 along its longitudinal axis 280 is open. The torch assembly is typically connected to a semiconductor processing system by this open end 260, as shown in FIG. 1B, thereby allowing gaseous oxidation products, for example ultrapure steam or hydrogen chloride gas, to exit the torch assembly and enter the semiconductor processing furnace. In a further preferred embodiment of the present invention, a flow divertor (118 in FIG. 1B), which is discussed hereinbelow in conjunction with FIGS. 10A and 10B, may be included between the torch assembly and the semiconductor processing furnace. Again as shown in FIGS. 2A and 2B, mounted on right end 270 of chamber 20 along its longitudinal axis 280 is gas injection subassembly 220 of the burner of the torch assembly. In the present embodiment, gas injection subassembly 220 is thermally welded to chamber 20 to provide an integral construction for the torch assembly, enabling fast and easy assembly and disassembly. In an alternative embodiment of the present invention, gas injection subassembly 220 may be removably but sealingly mounted to chamber 20. The present embodiment, as shown in FIG. 2A, has three conduits for gas input: two hydrogen conduits 221, one for high-flow and one for low-flow hydrogen; and an oxygen or other gas conduit 223 with a "tee" 224 for introducing an additional gas such as DCE vapor.

Referring now to FIGS. 4 through 9B, there are shown a number of views of gas injection subassemblies constructed and operative in accordance with alternative embodiments of the present invention. Common to all gas injection subassemblies constructed and operative in accordance with the present invention are an emitting surface having formed thereon orifices for the combustible gases, and gas routing apparatus connecting the orifices to supplies of the gases. The orifices are of a size and orientation to direct the gas flows, for desired predetermined gas flow rates, to a predetermined zone of intersection and mixing wherein oxidation is to take place, that is far enough from the emitting surface and with sufficient velocity to preclude exposure thereof to the combustion flame, thereby preventing risk of devitrification or damage to the surface and to its orifices. The mixed gas flow and, hence the combustion flame, further will be generally parallel to longitudinal axis 280 of quartz chamber 20 (FIG. 2A).

Figure 4:
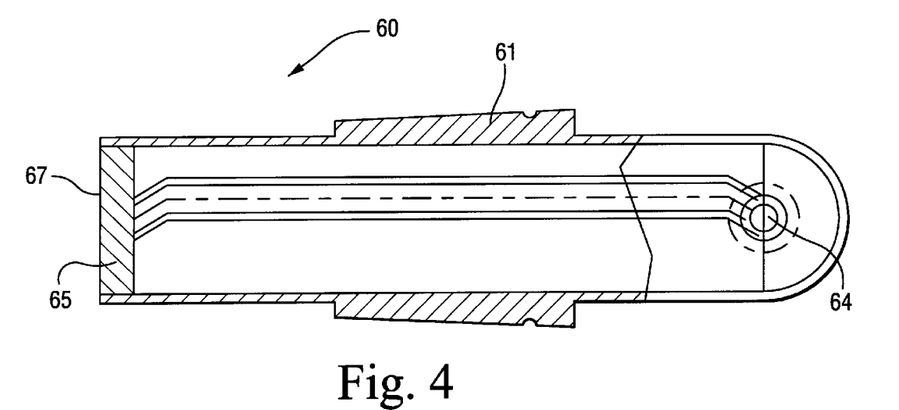
FIGS. 4 and 5 are two side-sectional views, taken perpendicular to one another, of a gas injection subassembly of a torch assembly in accordance with an alternative embodiment of the present invention.
Figure 5:
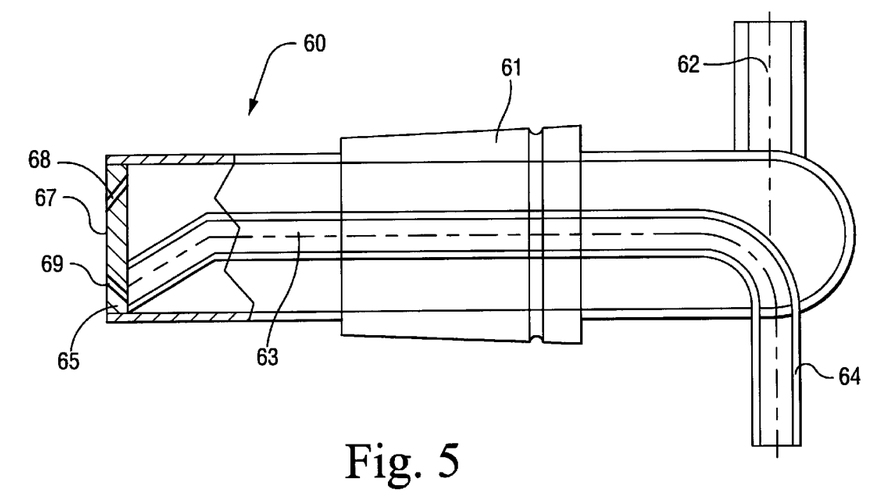

Referring now to FIGS. 4 and 5, there are shown two side-sectional views, taken perpendicular to one another, of a gas injection subassembly, referred to generally as 60, according to an alternative embodiment of the present invention. The body of gas injection subassembly 60 is the conduit for one combustible gas via gas inlet 62, and a conduit 63 for a second combustible gas via inlet 64 passes therethrough. Gas injection subassembly 60 has a faceplate 65 thermally welded to body of subassembly 60 and conduit 63 with orifices 68 and 69 formed thereon, preferably by laser drilling therethrough, to allow emission of flows of the gases at predetermined angles with respect to the faceplate surface and each other. Second combustible gas conduit 63 is welded to the back of faceplate 65 so as to surround one orifice 69. In the present embodiment, orifices 68 and 69 are oriented with respect to emitting surface 67 so that the gas flows therefrom are at an angle in the range 10°–170° with diameters in the range 0.2–1.8 mm. Gas injection subassembly 60 may optionally further include a mounting portion 61 for sealingly mounting gas injection subassembly 60 to quartz chamber 20 (FIG. 2A).

Figure 6:
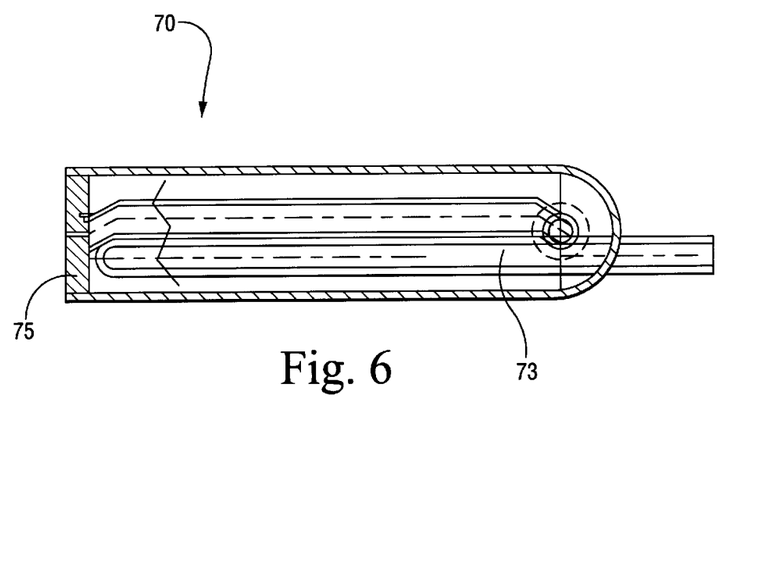
FIGS. 6 and 7 are two side-sectional views, taken perpendicular to one another, of a gas injection subassembly of a torch assembly in accordance with a further alternative embodiment of the present invention.
Figure 7:
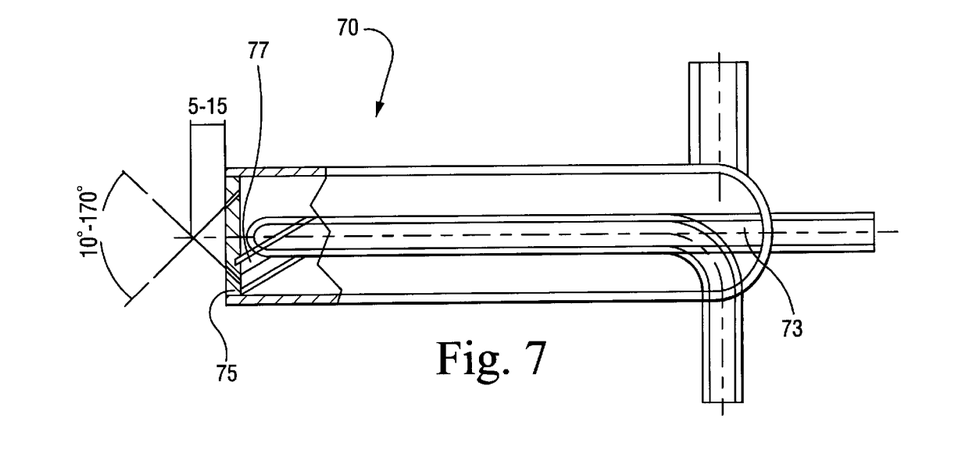

Referring now to FIGS. 6 and 7, there are shown two side-sectional views, taken perpendicular to one another, of a gas injection subassembly, referred to generally as 70, according to a further alternative embodiment of the present invention. The present embodiment differs from the previous embodiment, shown in FIG. 4 in that it includes an extra internal conduit 73 with an extra associated orifice 77 on faceplate 75 and its own second gas inlet. This allows a single torch assembly to provide a choice or a sequence of two second oxidation gases, for example: oxygen for steam production, and DCE and oxygen for HCl production, the flow of which is entirely under control of gas flow control valves external to the torch itself.

Figure 8:
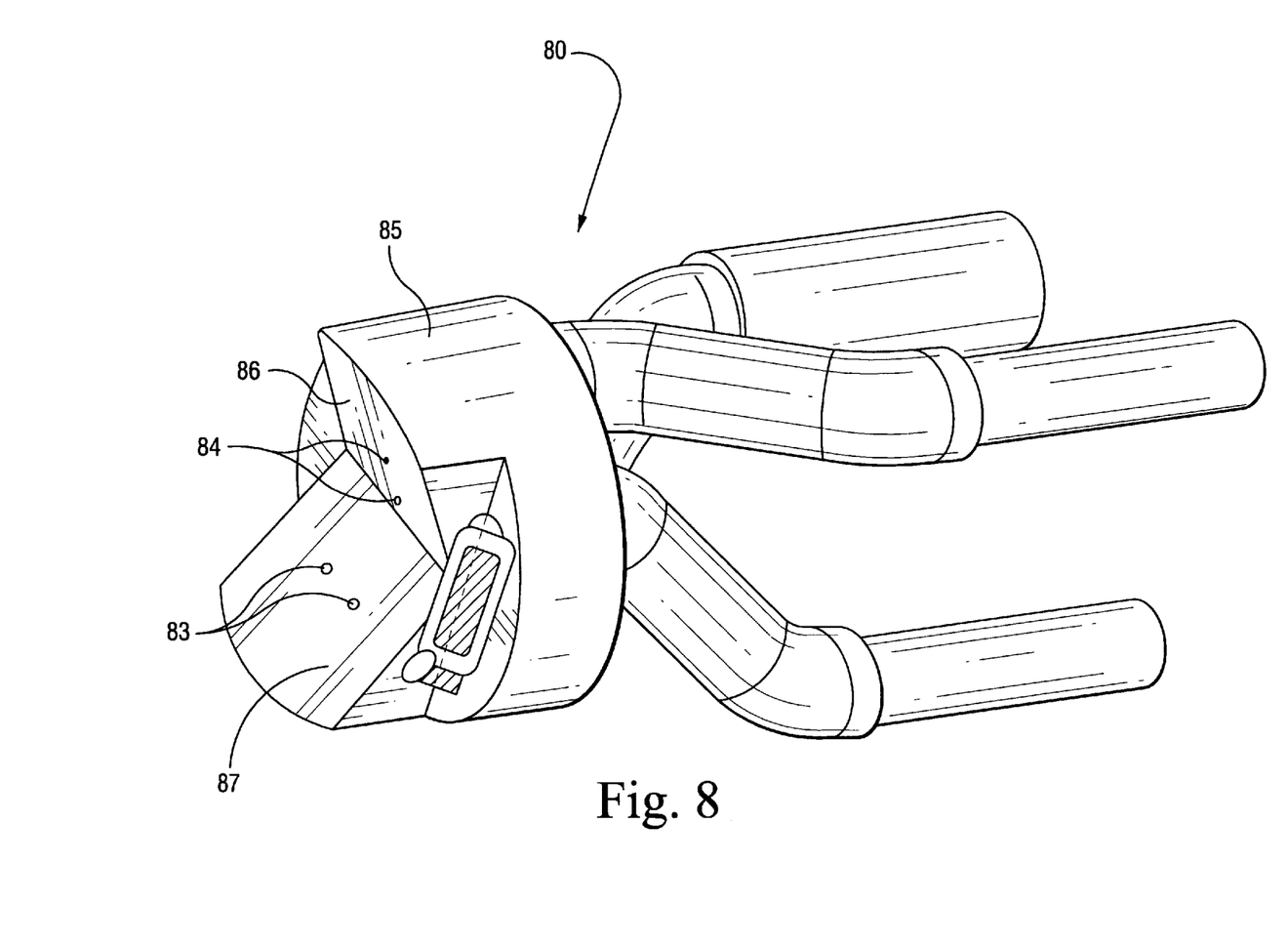
FIG. 8 is a transverse view of a gas injection subassembly of a torch assembly in accordance with a preferred embodiment of the present invention.
Figure 9A:
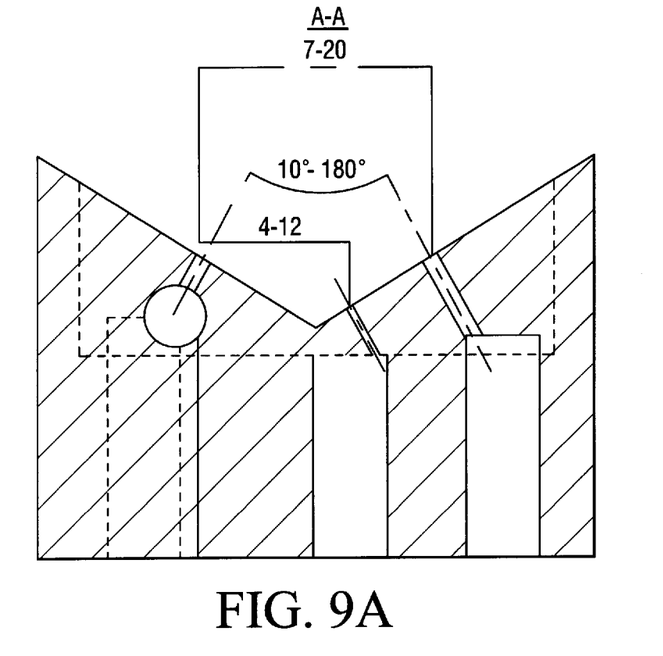
FIGS. 9A and 9B are detailed views of gas injection nozzles of the gas injection subassembly of FIG. 8.
Figure 9B:
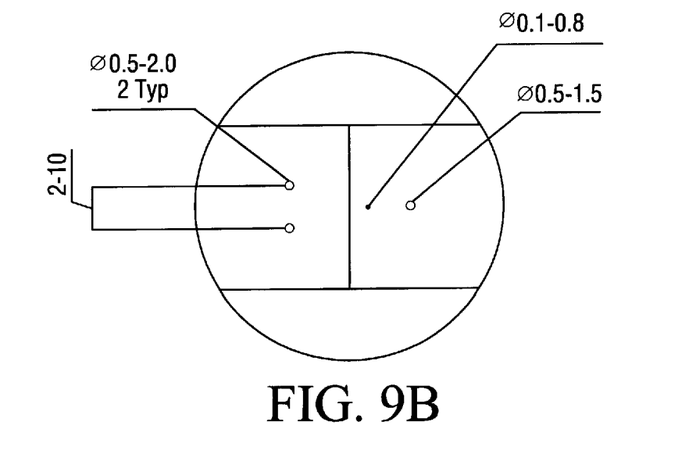

Referring now to FIG. 8, there is shown a transverse view of a gas injection subassembly, referred to generally as 80, according to a preferred embodiment of the present invention. Gas injection subassembly 80 has a solid gas emitting head 85 with separate emitting surfaces 86 and 87 for each of the two oxidation gases with a predetermined angle, in the present embodiment in the range 10°–180°, therebetween. Emitting surfaces 86 and 87 each have formed thereon two orifices 83 and 84 for gas flow emission. As opposed to the previous embodiments (FIGS. 6 and 7), the orifices 83 and 84 and the gas flow are substantially perpendicular to the emitting surfaces 86 and 87, due to the angle of emitting surfaces. This has been shown to be an advantage in the present embodiment, since this perpendicular gas flow is less likely to become turbulent as it emerges, thereby providing a faster gas flow that is less likely to broaden. As in the previous embodiment shown in FIGS. 6 and 7, each of the two second gas orifices has its own gas conduit, while the two first gas orifices are fed by a single gas conduit. In the present embodiment, first gas orifices 83 have diameters in the range 0.5–2.0 mm, and two second gas orifices 84 have diameters in the range 0.1–0.8 mm and 0.5–1.5 mm, as shown in FIG. 9B. As will be understood by those familiar with the art, the smaller orifices will provide faster gas flows, which will, when combustion takes place, produce a longer flame, which, for the case of lower gas flow rates, will be more readily detectable by a flame detector (not shown) associated with controller 140 (FIG. 1A), thereby providing better control of the operation of torch assembly 10.

Figure 10A:
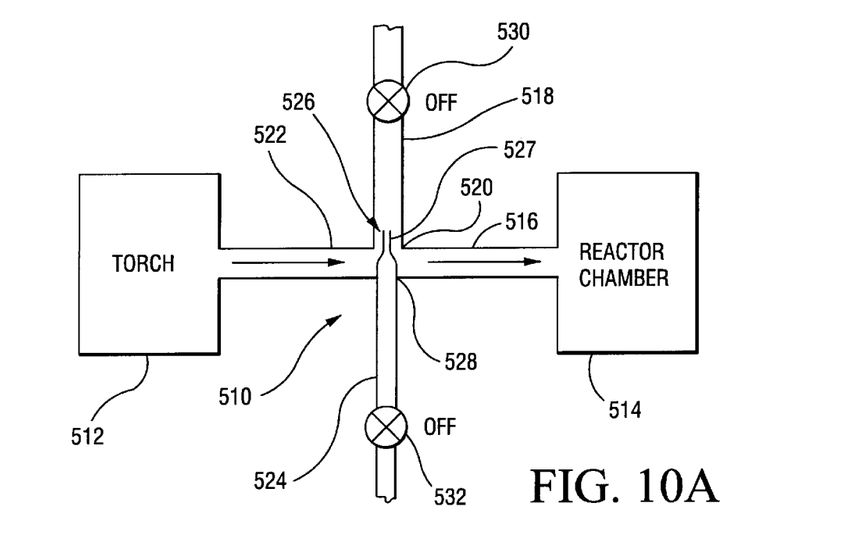
FIGS. 10A and 10B are detail schematic block diagrams of a flow divertor in a semiconductor processing system employing the torch assembly of a further embodiment of the present invention, in which oxidation gases are seen to be permitted and to be prevented, respectively, to reach the semiconductor reactor chamber.
Figure 10B:
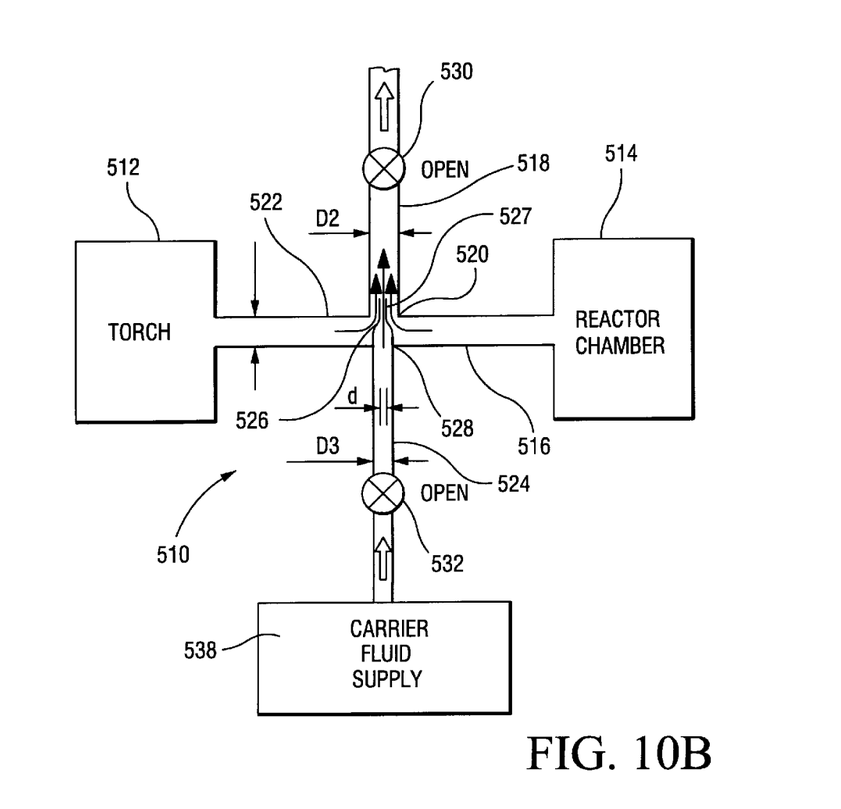

Referring briefly again to FIG. 1B, there is shown a block diagram of a semiconductor processing system employing a torch assembly 10 constructed and operative in accordance with an alternative embodiment of the present invention. The embodiment in the diagram includes flow divertor 118 to control the flow of combustion gases from torch 111 to process furnace 115. Referring now to FIGS. 10A and 10B, there are shown detail schematic block diagrams of a flow divertor, referred to generally as 510 in a semiconductor processing system employing the torch assembly of the present invention. Flow divertor 510 is used to selectably prevent oxidation product gases produced by torch 512 from reaching reactor chamber 514.

The flow divertor of the present embodiment is particularly suited for use with wet oxidation processes, used for rapid oxidation of silicon, in the semiconductor industry. The particular suitability of the present embodiment in wet oxidation processes will be appreciated from the fact that, unlike prior art systems, it has no moving parts which come into contact with the oxidation products, and thus no contaminant particles can be released into the process fluid stream, by the apparatus of the present embodiment.

It will be appreciated, however, that the present invention may also be suitable for use in other technological applications, and it is thus not intended to limit the present invention solely to use in the semiconductor industry.

Flow divertor 510 includes a secondary conduit 518 which intersects with and communicates with primary conduit 516 via an outlet 520 formed in a side wall 522 of primary conduit 516, at a location upstream of reactor chamber 514. There is further provided a tertiary conduit 524 which also intersects with primary conduit 516. Tertiary conduit 524 has a free end portion 526 which extends through an opening 528 formed opposite the outlet 520 so as to extend across primary conduit 516 and such that it protrudes through outlet 520 into the secondary conduit 518. As seen, free end portion 526 defines an end constriction 527 having a narrow orifice just inside secondary conduit 518, the function of which is described below.

As seen in the drawings, the free end portion 526 of tertiary conduit 524 has a diameter which is smaller than that of the primary conduit 516 so as not to prevent fluid flow therewithin, and, further, which is also smaller than the diameter of the secondary conduit 518, so as not to obstruct fluid flow therewithin, of fluid flowing through outlet 520. Secondary conduit 518 has an outlet valve 530, which may be of any suitable type, arranged downstream of outlet 520, and tertiary conduit 524 has an inlet valve 532, which may be similar to outlet valve 530, disposed in regulatory association with a carrier fluid supply 538.

When it is sought to permit normal flow of the oxidation products from torch 512 to process chamber 514, valves 530 and 532 are closed or off, and the flow through primary conduit 516 is uninterrupted. When it is sought to interrupt the flow, however, in a manner which prevents the oxidation products from reaching reactor chamber 514, but, unlike the prior art, avoids introduction of contaminant particles into the process fluid, valves 530 and 532 are opened, thereby to permit injection of the carrier fluid, via valve 532 and tertiary conduit 524, into secondary conduit 518.

The outflow of the carrier fluid into secondary conduit 518, through narrow constriction 527 formed at free end 526 of tertiary conduit 524, is operative to cause a pressure drop, due to the well-known Venturi effect. The pressure at which the carrier fluid is supplied, combined with the geometry of secondary and tertiary conduits 518 and 524, are operative to cause a pressure drop between primary and secondary conduits 516 and 518, such that oxidation products in primary conduit 516 are forced through outlet 520, into secondary conduit 518. Subsequent closing of valves 530 and 532 removes the pressure drop, and the oxidation products then resumes their flow along primary conduit 516, to reactor chamber 514.

As described above, the present embodiment is particularly suitable for use in wet oxidation of silicon, in which case the oxidation product is a steam, and the carrier fluid is an inert gas, such as nitrogen. It is also suitable for DCE oxidation, in which case the oxidation product is HCl. In certain semiconductor processes, it is desirable to introduce auxiliary chemicals into the reactor chamber. In an alternative embodiment of the present invention, primary conduit 516 has an auxiliary input conduit (not shown) for the introduction of these auxiliary chemicals.

In this case, the pressure of the steam flowing in primary conduit 516 will be just above atmospheric pressure, and the pressure in secondary conduit 518 required to divert the entire steam flow from the primary conduit 516 will be somewhat below atmospheric, typically in the range 5600–5700 mm Hg. This will be generated by a flow of inert gas supplied at a pressure in the range 510 psi –5100 psi.

Furthermore, referring particularly to FIG. 10B, the internal dimensions of primary, secondary and tertiary conduits 516, 518, and 524 will typically be as follows:

| | |
|---|---|
| primary conduit 516 | internal diameter D1: 8–520 mm |
| secondary conduit 518 | internal diameter D2: 6–7 mm |
| tertiary conduit 524 | internal diameter D3: 5–7 mm |
| tertiary conduit 524, orifice of end construction 527 | internal diameter d: 1–3 mm |

It will be appreciated by persons skilled in the art that, the present invention is not limited solely to wet oxidation processes, and may be used in other environments in which it is sought to eliminate direct contact between valves having moving parts, and a process fluid. In these cases, the various pressures required to achieve diversion of a fluid flow from the primary conduit 516, as described hereinabove, as well as the geometry of the conduits 516, 518 and 524, and of the orifice of end constriction 527, will be determined in accordance with the nature of the liquids or gases employed, and with the nature of the process.

It will further be appreciated by persons skilled in the art that the scope of the present invention is not limited by what has been specifically shown and described hereinabove, merely by way of example. Rather, the scope of the present invention is defined solely by the claims, which follow.

What is claimed is:

1. For use with a reactor chamber for semiconductor processing, a torch assembly for combustion and flameless oxidation processes including:

a quartz chamber for sustaining therein combustion and flameless oxidation processes, said quartz chamber defining a longitudinal axis and having first and second ends of which at least said second end is open so as to allow exit therethrough of gaseous oxidation products which are produced by oxidation of gases in said quartz chamber, a gas injection subassembly mounted in association with said first end of said quartz chamer, said gas injection subassembly having a first gas injection nozzle and a second gas injection nozzle and first conduits and second conduits connecting said nozzles to supplies of first and second gases respectively;

a starter unit associated with said gas injection subassembly, including a radiant energy emitter and at least one radiant energy absorber, said at least one radiant energy absorber operative, in response to radiant energy emitted from said radiant energy emitter, to provide at least one hot spot to initiate oxidation of said first and second gases in a preselected zone of said quartz chamber;

at least one heater mounted generally parallel to said longitudinal axis within said quartz chamber for heating the first and second gases to a temperature sufficient to sustain oxidation thereof in said preselected zone of said quartz chamber;

a cooling arrangement in heat exchange association with a wall portion of said quartz chamber; and a controller associated with the torch assembly for controlling operation thereof.

2. A torch assembly according to claim 1 wherein said cooling arrangement includes apparatus for directing a flowable cooling medium in heat exchange association with preselected portions of said wall portion of said quartz chamber.

3. A torch assembly according to claim 1 wherein said wall portion is a double wall having inner and outer leaves having mutually facing surfaces defining a space therebetween, and said cooling arrangement includes apparatus for directing a flow of a flowable cooling medium through said space in heat exchange association with said inner leaf.

4. A torch assembly according to claim 3 wherein at least one of said mutually facing surfaces of said inner and outer leaves has formed thereon ridges for defining a generally helical flow path for the flowable cooling medium.

5. A torch assembly according to claim 1 wherein said radiant energy emitter includes at least one lamp and said at least one radiant energy absorber includes at least one blackbody member positioned at a predetermined distance from said lamp.

6. A torch assembly according to claim 5 wherein said at least one lamp is a quartz-halogen lamp with a tungsten filament.

7. A torch assembly according to claim 5 wherein said at least one blackbody member is at least one silicon-carbide member.

8. A torch assembly according to claim 5 wherein said at least one blackbody member is at least one quartz-encapsulated, silicon-carbide member.

9. A torch assembly according to claim 5 wherein said at least one blackbody member is at least one evacuated, quartz-encapsulated, silicon-carbide member.

10. A torch assembly according to claim 1 wherein said gas injection subassembly is integrally coupled with said first end of said quartz chamber.

11. A torch assembly according to claim 1 wherein said gas injection subassembly is removably mounted onto said first end of said quartz chamber and wherein said gas injection subassembly includes apparatus for sealing said gas injection subassembly to said first end of said chamber.

12. A torch assembly according to claim 1 wherein said at least one heater is at least two heaters and where each of said at least two heaters is operable alone to heat said first and second gases to a temperature sufficient to sustain oxidation thereof in said preselected zone of said quartz chamber, and wherein said controller is operative, in the case of a failure of at least one of said at least two heaters, to cause a non-failing heater to operate alone so as to heat the first and second gases to a temperature sufficient to sustain oxidation thereof in said preselected zone of said quartz chamber.

13. A torch assembly according to claim 1 wherein:

said first gas injection nozzle is operative to provide a stream of the first gas along a first axis oriented at a predetermined first angle with respect to said longitudinal axis and at at least a minimum predetermined exit velocity; and said second gas injection nozzle is operative to provide a stream of the second gas along a second axis oriented at a predetermined second angle with respect to said longitudinal axis and at at least a minimum predetermined exit velocity, thereby to mix the first and second gases and to produce a mixed stream thereof generally along said longitudinal axis.

14. A torch assembly according to claim 13 wherein said first angle is in the range of 5°–90°.

15. A torch assembly according to claim 13 wherein said second angle is in the range of 5°–90°.

16. A torch assembly according to claim 13 wherein:

said first gas injection nozzle has formed therein at least one orifice aligned with or parallel to said first axis; and said first conduits further include apparatus for selectably supplying the first gas to said at least one first gas orifice, so as to cause an outflow of a stream of the first gas generally along said first axis, said outflow having an orifice exit velocity of at least said minimum predetermined velocity.

17. A torch assembly according to claim 16 wherein:

said first gas injection nozzle has formed therein at least two first gas orifices; and said first gas supply apparatus further includes apparatus for selectably supplying said first gas to at least a selected one of said at least two first gas orifices, so as to cause an outflow from each said selected first gas orifice of a stream of the first gas generally parallel to said first axis, each said outflow having an orifice exit velocity of at least said minimum predetermined velocity.

18. A torch assembly according to claim 17, wherein each of said at least two first gas orifices has a diameter different from at least one other of said first gas orifices.

19. A torch assembly according to claim 13 wherein:

said second gas injection nozzle has formed therein at least one orifice aligned with or parallel to said second axis; and said second conduits further include apparatus for selectably supplying the second gas to said at least one second gas orifice, so as to cause an outflow of a stream of the second gas generally along said second axis, said outflow having an orifice exit velocity of at least said minimum predetermined velocity.

20. A torch assembly according to claim 19 wherein:

said second gas injection nozzle has formed therein at least two second gas orifices; and said second gas supply apparatus further includes apparatus for selectably supplying the second gas to at least a selected one of said at least two second gas orifices, so as to cause an outflow from each said selected second gas orifice of a stream of the second gas generally parallel to said second axis, each said outflow having an orifice exit velocity of at least said minimum predetermined velocity.

21. A torch assembly according to claim 20, wherein each of said at least two second gas orifices has a diameter different from at least one other of said second gas orifices.

22. A torch assembly according to claim 13 wherein said gas injection subassembly has a single emitting surface generally perpendicular to said longitudinal axis and said first and second gas injection nozzles are located therein such that said first and second angles are no greater than 90° and said first and second streams of gas converge and mix in a predetermined zone downstream from said emitting surface.

23. A torch assembly according to claim 13 wherein said gas injection subassembly has first and second emitting surfaces in which are located said first and second gas injection nozzles respectively, and wherein said first and second gas streams are generally perpendicular to said first and second emitting surfaces respectively and said first and second gas injection nozzles are located such that said first and second streams of gas converge and mix in a predetermined zone downstream from said emitting surfaces.

24. A torch assembly according to claim 1 further including a flow divertor situated between said open second end of said quartz chamber and a reactor chamber for semiconductor processing for selectably preventing the gaseous oxidation products from reaching the reactor chamber, which includes:

a primary conduit for conducting gaseous oxidation products from said quartz chamber to the reactor chamber;

a secondary conduit intersecting with and communicating with said primary conduit via an outlet formed in a side wall thereof at a location upstream of the reactor chamber; and apparatus for selectably applying a pressure drop across said primary conduit and said secondary conduit, thereby causing the gaseous oxidation products in said primary conduit to flow into said secondary conduit, thus to prevent the gaseous oxidation products from reaching the reactor chamber.

25. A torch assembly according to claim 24 wherein:

said apparatus for selectably applying includes:

a tertiary conduit intersecting with said primary conduit and having a free end portion which extends through an opening formed in said primary conduit so as to protrude through said outlet into said secondary conduit;

said free end portion of said tertiary conduit having a diameter smaller than that of said primary conduit so as not to prevent fluid flow therewithin;

said free end portion of said tertiary conduit further having a diameter smaller than that of said secondary conduit so as not to obstruct fluid flow therewithin from said outlet into said secondary conduit; and an injection conduit for selectably injecting a carrier fluid through said tertiary conduit and into said secondary conduit, thereby giving rise to a Venturi effect in said secondary conduit, so as to cause gaseous oxidation products in said primary conduit to flow into said secondary conduit.

26. A torch assembly according to claim 25 wherein said injection conduit includes an inlet valve associated with an upstream carrier fluid source, and said flow divertor further inluding an outlet valve associated with a downstream portion of said secondary conduit, distal to said outlet, wherein, when said inlet and outlet valves are closed, gaseous oxidation products are permitted to flow along said primary conduit from said quartz chamber to said reactor chamber, and wherein, when said inlet and outlet valves are open, gaseous oxidation products flowing downstream from said quartz chamber to the reactor chamber are forced to exit said primary conduit into said secondary conduit.

27. A torch assembly according to claim 24 wherein said primary conduit includes an auxiliary input conduit for adding preselected auxiliary chemical substances to the gaseous oxidation products flowing in said primary conduit.

28. A torch assembly according to claim 25 wherein said carrier fluid is a carrier gas.

29. A torch assembly according to claim 28 wherein said carrier gas is an inert gas.

30. A torch assembly according to claim 1 further including:
- a flame detector associated with said controller and operative to verify the presence of flame combustion of the first and second gases in said preselected zone of said quartz chamber; and
- a multiplicity of temperature sensors associated with said controller and positioned at a multiplicity of predetermined locations in and in association with said quartz chamber.

31. A torch assembly according to claim 1 wherein the first gas is one of a single first gas and a mixture at a preselected concentration of at least two of a plurality of preselected first gases and
- wherein said first conduits include branching and mixing conduits and first gas flow control apparatus and said second conduits include second gas flow control apparatus for selectively producing and supplying mixtures at preselected concentrations of the first and second gases;

said first and second conduits are selectably operable to supply one of:
- a first gas which is a mixture at a preselected concentration of oxygen and dichlorethylene (DCE) vapor suspended at predetermined concentrations in nitrogen and no second gas; thereby, in presence of suitable environmental conditions, to give rise to flameless oxidation; and
- a first gas which is one of
    - oxygen and
    - a mixture at a preselected concentration of oxygen and dichlorethylene (DCE) vapor suspended at predetermined concentrations in nitrogen
- and a second gas which is hydrogen; thereby, in presence of suitable environmental conditions, to give rise to combustion.

* * * * *